United States Patent
Pathak et al.

(10) Patent No.: US 11,604,906 B2
(45) Date of Patent: Mar. 14, 2023

(54) SYSTEM AND METHOD FOR CRASHWORTHINESS ANALYTICS IN DESIGN

(71) Applicant: Dassault Systemes Simulia Corp., Johnson, RI (US)

(72) Inventors: Anand Narayan Pathak, Maharashtra (IN); Yangwook Choi, Warwick, RI (US); Rajesh Dadaji Nagose, Maharashtra (IN)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 779 days.

(21) Appl. No.: 16/573,729

(22) Filed: Sep. 17, 2019

(65) Prior Publication Data

US 2021/0081512 A1 Mar. 18, 2021

(51) Int. Cl.
  *G06F 30/15* (2020.01)
  *G06F 30/20* (2020.01)
  *G06T 17/20* (2006.01)

(52) U.S. Cl.
  CPC .............. *G06F 30/15* (2020.01); *G06F 30/20* (2020.01); *G06T 17/20* (2013.01)

(58) Field of Classification Search
  CPC ....................................................... G06F 30/15
  See application file for complete search history.

(56) References Cited

U.S. PATENT DOCUMENTS

| | | | | |
|---|---|---|---|---|
| 5,748,943 A | * | 5/1998 | Kaepp | G06F 30/15 |
| | | | | 706/14 |
| 6,721,642 B1 | * | 4/2004 | Wu | B60R 21/0173 |
| | | | | 701/45 |

(Continued)

FOREIGN PATENT DOCUMENTS

| | | | | |
|---|---|---|---|---|
| CN | 112989521 B | * | 8/2021 | |
| EP | 2953040 A1 | * | 12/2015 | ............. G06F 17/50 |
| EP | 2953040 A1 | | 12/2015 | |

OTHER PUBLICATIONS

Lange, Volker A., et al. "Early Phase Modeling of Frontal Impacts for Crashworthiness: From Lumped Mass-Spring Models to Deformation Space Models." Proceedings of the Institution of Mechanical Engineers, Part D: Journal of Automobile Engineering, vol. 233, No. 12, pp. 3000-3015 (Year: 2018).*
European Extended Search Report, Application No. 20196097.8, dated Mar. 1, 2021, 14 pps.
Andre Filipe et al., "Modeling of automotive structures using dynamic behaviour simulation software", Jul. 1, 2013, 123 pps.

(Continued)

*Primary Examiner* — Akash Saxena
(74) *Attorney, Agent, or Firm* — Armstrong Teasdale LLP

(57) ABSTRACT

A computer-aided design system includes a display device, a memory storing a plurality of response surface models, and a processor configured to: (a) display a graphical user interface that includes a model of a vehicle frame; (b) display a section configuration panel that includes one or more section dimension values for one or more section dimensions of a first section member of the plurality of section members; (c) retrieve a first response surface model based on values of the one or more section dimensions for the first section member; (d) determine one or more predicted values associated with the first section member based on the values of the section dimensions, the predicted values include one or more predicted crash resistances for the section member; and (e) display the predicted values, thereby allowing the user to evaluate the predicted values for suitability in vehicle design.

14 Claims, 7 Drawing Sheets

(56) References Cited

U.S. PATENT DOCUMENTS

| | | | | |
|---|---|---|---|---|
| 6,980,939 | B2* | 12/2005 | Dhir | G06F 30/00 703/22 |
| 7,096,170 | B2* | 8/2006 | Fujita | B60G 15/00 703/2 |
| 7,664,623 | B1* | 2/2010 | Hallquist | G06F 30/23 703/2 |
| 10,331,821 | B1* | 6/2019 | Brennan | G06F 30/15 |
| 2002/0016697 | A1* | 2/2002 | Nishigaki | G06F 30/23 702/183 |
| 2003/0046049 | A1* | 3/2003 | Chatfield | F02D 41/1406 703/6 |
| 2006/0010427 | A1* | 1/2006 | Hoffman | G06F 30/00 717/124 |
| 2008/0265095 | A1* | 10/2008 | Lee | B64C 1/065 264/630 |
| 2009/0119031 | A1* | 5/2009 | Niwa | G06F 30/23 702/170 |
| 2009/0228246 | A1* | 9/2009 | Lacome | G01N 3/48 703/2 |
| 2010/0161296 | A1* | 6/2010 | Wainscott | G06F 30/23 703/6 |
| 2010/0305921 | A1* | 12/2010 | Hashimoto | F02D 41/2429 703/2 |
| 2011/0015902 | A1* | 1/2011 | Cheng | F16F 7/128 296/187.03 |
| 2011/0238401 | A1 | 9/2011 | Fonseka | |
| 2012/0245913 | A1* | 9/2012 | Neville | G16H 20/30 703/11 |
| 2015/0347650 | A1* | 12/2015 | Hallquist | G06F 30/15 703/2 |
| 2018/0285502 | A1* | 10/2018 | Hallquist | G06T 17/20 |
| 2020/0004923 | A1* | 1/2020 | Wang | G06F 30/20 |
| 2021/0081512 | A1* | 3/2021 | Pathak | G06F 30/12 |

OTHER PUBLICATIONS

Jae Moon Lim, "Lumped Mass-Spring Model Construction For Crash Analysis Using Full Frontal Impact Test Data", International Journal of Automotive Technology, vol. 18, No. 3, Apr. 1, 2017, pp. 463-472.

Witold Pawlus et al., "Development of lumped-parameter mathematical models for a vehicle localized impact", Journal of Mechanical Science and Technology, vol. 25, No. 7, Jul. 29, 2011, pp. 1737-1747.

Ambrosio, Jorge and Goncalves, Joao. Vehicle Crashworthiness design and analysis by means of nonlinear flexible multibody dynamics, 2001, Int J. Vehicle Design (Special Issue), vol. 26, No. 4.

Liao, X., Li, Q., Yang, X., Zhang, W., Li, W., Multi-objective optimization for crash safety design of vehicles using stepwise regression model, 2008, Struct Multidisc Optium 35, pp. 561-569.

Sousa, L., Verissimo, P., Ambrosio, J., Development of generic multibody road vehicle models for crashworthiness, 2008, Multibody Syst Dyn 19, pp. 133-158.

Duddeck, F., Wehrle, E., Recent Advances on Surrogate Modeling for Robustness Assessment of Structures with respect to Crashworthiness Requirements, 2015, 10th European LS-DYNA Conference.

Fang, J., Sun, G., Qin, N., Kim, N. H., Li, Q., On design optimization for structural crashworthiness and its state of the art, 2016, Struct Multidisc Optim.

Georgiou, G., Zeguer, T., On the assessment of the macro-element methodology for full vechile crashworthiness analysis, 2017, International Journal of Crashworthiness.

Dias, J.P., Pereira, M.S., Optimization methods for crashworthiness design using multibody models, 2004, Computers and Structures 82 pp. 1371-1380.

Ambrosio, J., Dias, J., A road vehicle multibody model for crash simulation based on the plastic hinges approach to structural deformations, 2007, International Journl of Crashworthiness, Jan.

Spethmann, P., Herstatt, C., Thomke, S. H., Crash simulation evolution and its impacton R&D in the automotive applications, 2009, Int. J. Product Development, vol. 8, No. 3.

Choi, Y., Freeman, S., Letailleur, F., Constructing a Concept Vehicle Strcuture Optimized for Crashworthiness, 2019, SAE 2019-01-0613.

Kamal, M.M. (1970), Analysis and simulation of vehicle to barrier impact, SAE Technical Paper 700414, 1970.

* cited by examiner

SYSTEM AND METHOD FOR CRASHWORTHINESS ANALYTICS IN DESIGN

BACKGROUND

This disclosure relates generally to simulation systems and, more particularly, to systems and methods for providing crashworthiness analytics in computer-aided design (CAD) in conceptual design engineering.

Automotive designers utilize computer-aided engineering (CAE) and design software to design and analyze aspects of new automobiles while under development, such as vehicle body structures (e.g., a vehicle frame). Design engineers may consider crashworthiness during the design of a new vehicle. Crashworthiness of a vehicle is the ability of the structure to protect its occupants in a crash. Crashworthiness performance analytics may consider, for example, how the vehicle structure may deform during certain types of impacts.

During a typical concept design phase for a new vehicle, designers may perform a conceptual crash analysis using various CAE tools. Conceptual crash analysis using finite element (FE) models are typically not appropriate since there are no geometries available to create the FE model and since the crash analysis using the FE model is too computationally intensive to be used in the conceptual design phase. As such, use of an abstract model can help enhance performance. One analytical approach involves generating an abstract model (e.g., a lumped mass-spring model) of the vehicle frame that can be used to optimize load paths, distributing crash force and energy throughout the entire structure. However, this method includes a time consuming process to determine the crash behavior of each spring and the difficulty issues in CAE. For example, a design engineer may need to perform trial-and-error on design components, assigning various parameters to each member (e.g., beam) of the frame and then testing with either physical tests or by finite element (FE) simulations. Considering the number of components of a typical vehicle model, finding appropriate sections for all components is impractical. Further, design engineers may not have the simulation and analytics backgrounds sufficient to perform, nor understand the output of, such simulations. Accordingly, what is needed is a system for providing crashworthiness analytics to design engineers in an efficient and understandable way during concept design, when available data is limited.

BRIEF DESCRIPTION

In one aspect, a computer-aided design system is provided. The computer-aided design system includes a display device. The computer-aided design system also includes a memory storing a plurality of surface models. Each surface model of the plurality of surface models is in an n-dimensional space including (a) one or more section dimensions of section members of a vehicle design and (b) one of force and moment. The computer-aided design system further includes a processor configured to execute instructions stored in the memory. When executed by the processor, the instructions cause the processor to display, to a user and on the display device, a graphical user interface that includes a model of a vehicle frame. The model includes a plurality of section members of the vehicle frame and a plurality of junctions connecting. Each junction of the plurality of junctions attaches two or more section members of the plurality of section members. The instructions also cause the processor to display, on the display device, a section configuration panel that includes one or more section dimension values for one or more section dimensions of a first section member of the plurality of section members. The instructions further cause the processor to retrieve a first response surface model from the plurality of response surface models based on values of the one or more section dimensions for the first section member. The instructions also cause the processor to determine one or more predicted values associated with the first section member based on the values of the one or more section dimensions of the first section member, the one or more predicted values include one or more predicted crash resistances for the section member. The instructions further cause the processor to display the one or more predicted values in the graphical user interface, thereby allowing the user to evaluate the one or more predicted values for suitability in vehicle design.

In another aspect, a method of providing a computer-aided design interface is provided. The method is performed by a processor with a memory. The method displaying, to a user and on a display device, a graphical user interface that includes a model of a vehicle frame. The model includes a plurality of section members of the vehicle frame and a plurality of junctions connecting. Each junction of the plurality of junctions attaches two or more section members of the plurality of section members. The method also includes displaying, on the display device, a section configuration panel that includes one or more section dimension values for one or more section dimensions of a first section member of the plurality of section members. The method further includes retrieving a first response surface model from a plurality of response surface models based on values of the one or more section dimensions for the first section member. Each response surface model of the plurality of response surface models is in an n-dimensional space including (a) one or more section dimensions of section members of a vehicle design and (b) one of force and moment. The method also includes determining one or more predicted values associated with the first section member based on the values of the one or more section dimensions of the first section member, the one or more predicted values include one or more predicted crash resistances for the section member. The method further includes displaying the one or more predicted values in the graphical user interface, thereby allowing the user to evaluate the one or more predicted values for suitability in vehicle design.

In yet another aspect, a computer-readable storage media having computer-executable instructions embodied thereon is provided. When executed by at least one processor, the computer-executable instructions cause the processor to store, in a memory, a plurality of response surface models. Each response surface model of the plurality of response surface models is in an n-dimensional space including (a) one or more section dimensions of section members of a vehicle design and (b) one of force and moment. The computer-executable instructions also cause the at least one processor to display, to a user and on the display device, a graphical user interface that includes a model of a vehicle frame. The model includes a plurality of section members of the vehicle frame and a plurality of junctions connecting. Each junction of the plurality of junctions attaches two or more section members of the plurality of section members. The computer-executable instructions further cause the at least one processor to display, on the display device, a section configuration panel that includes one or more section dimension values for one or more section dimensions of a first section member of the plurality of section members.

The computer-executable instructions also cause the at least one processor to retrieve a first response surface model from the plurality of response surface models based on values of the one or more section dimensions for the first section member. The computer-executable instructions further cause the at least one processor to determine one or more predicted values associated with the first section member based on the values of the one or more section dimensions of the first section member. The one or more predicted values include one or more predicted crash resistances for the section member. The computer-executable instructions also cause the at least one processor to display the one or more predicted values in the graphical user interface, thereby allowing the user to evaluate the one or more predicted values for suitability in vehicle design.

BRIEF DESCRIPTION OF THE DRAWINGS

FIG. 1 is a diagram of an example computer-aided design (CAD) system that includes a section design module for configuring section parameters of a frame model during concept design of a vehicle.

FIG. 2 is a diagram illustrating various sub-modules of the section design module shown in FIG. 1.

FIG. 3 illustrates an example view of a design interface presented by the design system to the user.

FIG. 4 illustrates another example view of the design interface in which a section configuration panel is provided.

FIG. 5 illustrates the section configuration panel provided by the section design module.

DETAILED DESCRIPTION

Figure 1:
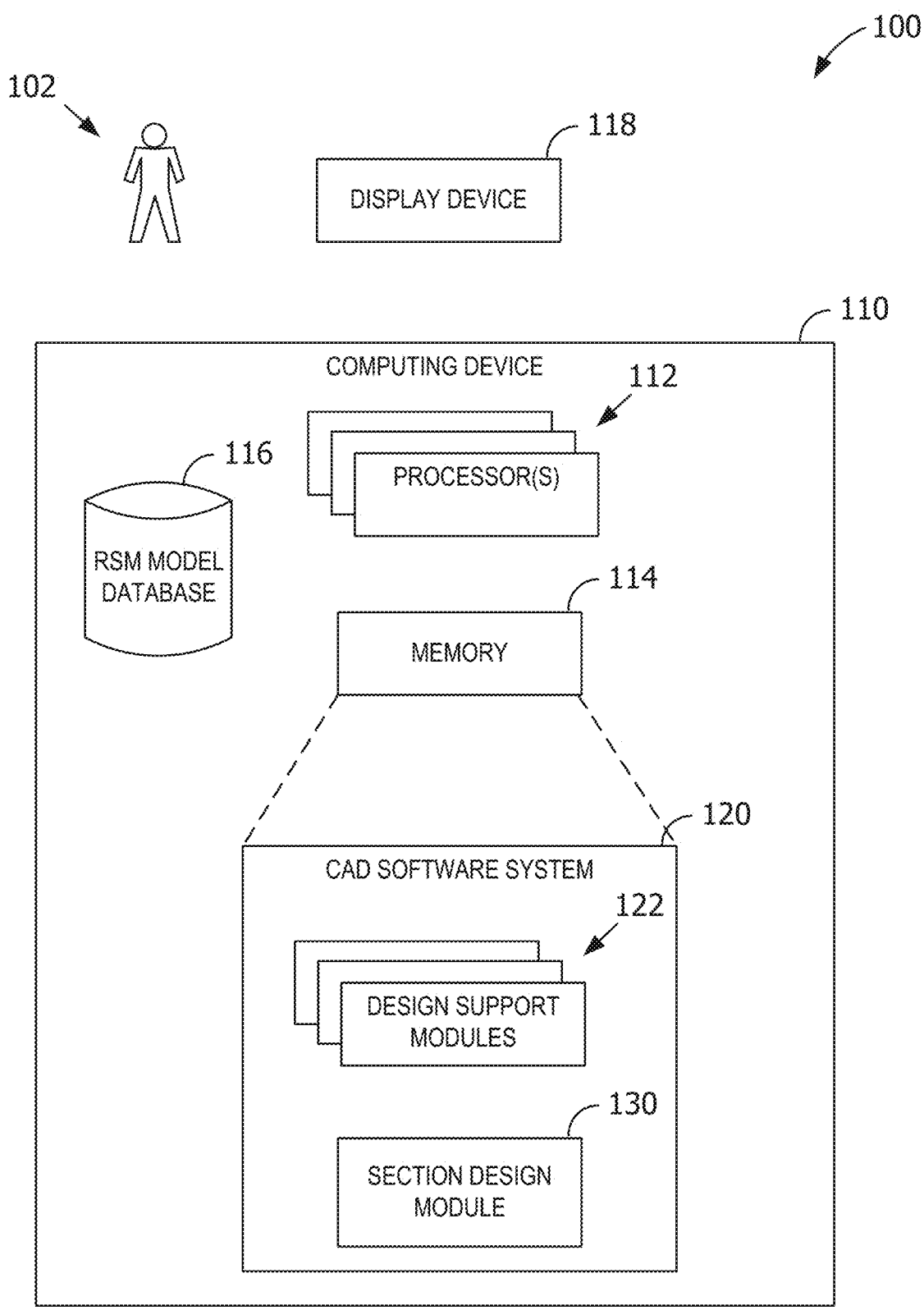
FIGS. 1-5 show exemplary embodiments of the methods and systems described herein.

The following detailed description illustrates embodiments of the disclosure by way of example and not by way of limitation. It is contemplated that the disclosure has general application to computer simulation with conceptual design engineering and crashworthiness analytics.

A design system provides a user interface that allows a design engineer to view crashworthiness data while configuring section dimensions for various members of a frame model. In a concept design phase of a vehicle, the design engineer creates a high level design (e.g., skeleton structure, load path) of a vehicle frame based on, for example, style, weight, powertrain, suspension type, layout, and so forth. This design is modeled as a lumped mass-spring (LMS) model in the design system and optimized for crashworthiness performance, giving insights into the crash loading paths and deformation sequences to structural engineers and helping engineers to understand how to design components to achieve improved crash response.

Once the LMS model is configured and optimized, the design engineer uses the design system to configure individual components (e.g., section members of the vehicle frame) via a design interface (e.g., a graphical user interface (GUI)). In an example embodiment, sections of the vehicle frame are rectangular beams with section dimensions of width, height, thickness, and material yield stress. The design interface presents the design engineer ("user") with a graphical representation of the LMS model, including a wire frame representation of the vehicle frame showing various section members and connection points between those members. The design interface allows the user to select and configure particular sections within the interface. The interface provides an overlay window that allows the user to change section dimensions, as well as to see various target parameters (e.g., force, moment) and predictions for that section. The target parameters for each section are configured (e.g., by a crash engineer (CE)) during initial model creation and optimization, and represent how much crash resistance (e.g., force, moment) that section member needs to withstand. The predictions for that section represent how the section is predicted to behave as currently configured (e.g., with the current section dimensions). The task of the design engineer is to find section parameters for each section that can achieve that target crash resistance, and in light of other design considerations (e.g., packaging space, availability of sheet metal gauges and material grades, internal weight and cost targets, dynamic/static stiffness targets, manufacturability constraints, and such).

To provide the predictions efficiently, numerous possible section designs and their resultant crash resistances are pre-determined and staged for use by the design system in the design interface. In one example embodiment, the design system precomputes or otherwise identifies response models that are used to approximate axial crush force based on particular section dimensions in a design space. For example, the design system may perform simulations to generate radial basis function (RBF) approximation models (e.g., response surfaces) of axial force and bending moment over the design space (e.g., over selected ranges of height, width, gauge, and material yield stress). These RBF approximation models are pre-computed and stored by the design system for use within the design interface. During operation, when the user selects a particular section, the design interface allows the user to vary the section parameters (e.g., via slide bars, selection buttons) over the design space of the RBF models. As the user changes any of the section parameters, the design system uses the altered design parameters and the stored RBF models to determine a projected force and moment for the section given the currently-selected design parameters. These predicted values are displayed adjacent to the target force and moment for the section, as well as a percentage error, allowing the user to quickly see predictions relative to targets. Since the RBF approximation models are pre-computed, the design system allows the designer to see target and prediction values determined based on concepts they understand (e.g., the design parameters) without having to switch into a simulation program and run simulations.

As used herein, an element or step recited in the singular and proceeded with the word "a" or "an" should be understood as not excluding plural elements or steps, unless such exclusion is explicitly recited. Furthermore, references to "exemplary embodiment" or "one embodiment" of the present disclosure are not intended to be interpreted as excluding the existence of additional embodiments that also incorporate the recited features.

As used herein, the term "database" may refer to either a body of data, a relational database management system (RDBMS), or both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only, and are thus not intended to limit in any way the definition and/or meaning of the term "processor."

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

In one embodiment of the present disclosure, a computer program is provided, and the program is provided on a computer readable medium. In an exemplary embodiment, the system is executed on a single computer system, without requiring a connection to a server computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

FIG. 1 is a diagram of an example computer-aided design (CAD) system (or just "design system") 100 that includes a section design module 130 for configuring section parameters of a frame model during concept design of a vehicle. In the example embodiment, the design system 100 includes a computing device 110 executing a CAD software system 120. The computing device 110 includes one or more processors 112 and a memory 114 storing the CAD software system 120. The computing device 110 is coupled to a display device 118 that allows a user 102 (e.g., a design engineer) to interface with the CAD software system 120 to perform various design activities, such as viewing a frame model of a vehicle, configuring section dimensions of frame sections, viewing target and predicted force and moment, and such other functionality as described herein. The computing device 110 may include other conventional hardware and software components of a conventional computing device (e.g., communication devices such as network interface cards or input/output devices such as keyboard, pointing device, touch screen, audio input/output devices, and such), but that these devices are not shown for purposes of brevity.

The CAD software system 120 includes various design support modules 122 that may be used to prepare for, execute, and evaluate the results of computer-based simulations and other such CAD functionalities. Such design support modules 122 may include, for example, 3D product design tools such as a computer-aided drafting (CAD) module, and analysis tools such as a finite element analysis module, a computational fluid dynamics module, and a computational electromagnetics module supporting computer-aided engineering (not separately shown). The CAD software system 120 allows users 102 to configure and execute various types of computer-implemented simulations, for example, in an effort to understand how their real-world counterparts will act or react under various conditions.

The CAD software system 120, in the example embodiment, also includes a section design module 130. The section design module 130 provides a graphical user interface ("design interface," not shown in FIG. 1) that allows the user 102 to view and configure aspects of frame design for a vehicle frame or other support structure. In an example embodiment, the section design module 130 displays an LMS model (not shown in FIG. 1) of a vehicle frame under design by the user 102. The section design module 130 renders the frame in the design interface, allowing the user 102 to manipulate a view of the frame (e.g., rotate, zoom in/out, and such), select members of the frame, view configuration data or properties of the selected member (e.g., section dimensions, target force/moment, probability data), and change section dimensions of selected members (e.g., width, height, gauge, material grade). The section design module 130 also determines crash resistance values for force and moment by applying current settings for the section dimensions to one or more pre-configured approximation models stored in a model database 116 (e.g., a library of RSM surfaces using RBF approximation models). In some embodiments, the design module 130 may determine a section geometry based on provided crash resistance values. RSM approximation can be based on a polynomial fit via a least squares regression of output parameters to input parameters. Depending on the selected order of the polynomial (e.g., linear, quadratic, cubic, quartic), initialization of the approximation uses a certain number of design points to be evaluated. The component being approximated can be executed multiple times to collect the required data, or a data file can serve as the initialization source. RBF approximation is a type of neural network employing a hidden layer of radial units and an output layer of linear units. RBF approximations are characterized by reasonably fast training and reasonably compact networks, and are useful in approximating nonlinear spaces. One example RBF may be:

$$\text{Axial Force} = \{A*\text{Height} + B*\text{Width} + C*\text{Material Elasticity} + D*\text{Thickness}\} + F,$$

where A, B, C, D, and F are all real numbers. This function may be second order or higher, as needed. After input is collected from the user, the value of axial force may be calculated using this function (e.g., as an equation form of an earlier-determined RSM). In some embodiments, the design module 130 may perform data lookup, where all of the data points which make up an RSM are stored, retrieved, and the design module 130 projects the data-point input by the user onto this cloud to derive various predictions.

During operation, when the user 102 selects a particular section member, the section design module 130 displays an overlay window containing configuration inputs that allow the user to view and change the current section dimensions (e.g., via buttons, slide bars, input boxes, and such). Upon detecting a change in one or more of the current section dimensions, the section design module 130 is configured to determine updated prediction data using the RBF approximation models and the current settings. The section design module 130 displays the updated prediction data in the overlay window, adjacent to the target data. In some embodiments, the section design module 130 may also determine and display a percentage error between target values and current prediction values.

Figure 2:
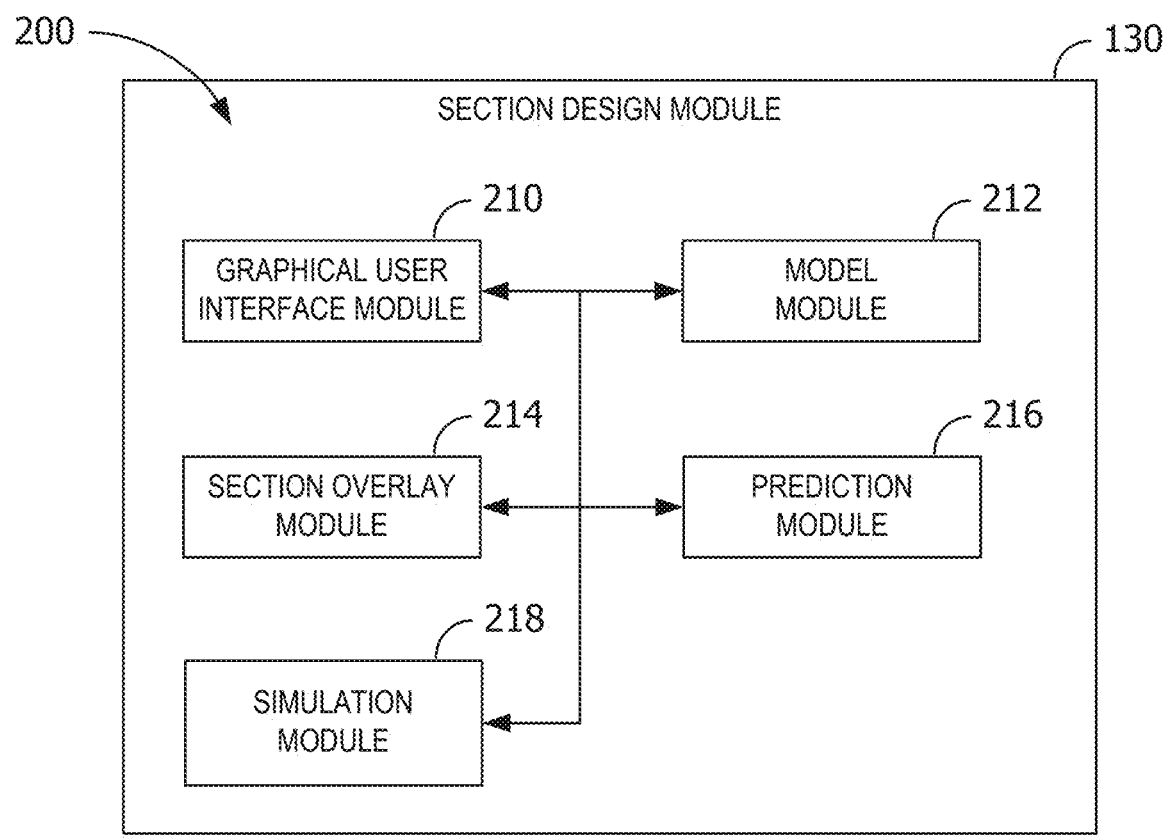

FIG. 2 is a diagram illustrating various sub-modules 200 of the section design module 130 shown in FIG. 1. Each of the various sub-modules 200 of the section design module 130 perform various functionality for generating material models using stability-based constrained numerical calibration, as described herein. In the example embodiment, the section design module 130 includes a graphical user interface (GUI) module 210, a model module 212, a section overlay module 214, a prediction module 216, and a simulation module 218 (collectively, "sub-modules 200"). Each of the various sub-modules 200 may interact with other sub-modules 200 when performing their respective functions.

In the example embodiment, the section design module 130 provides a graphical user interface (not shown in FIG. 2) through which the user 102 may interface with aspects of the section design module 130. The GUI module 210 provides the graphical user interface functionality to the user 102 via the display device 118 for many of the sub-modules 200, allowing the user 102 to, for example, view and manipulate LMS models of a vehicle frame, view and edit section dimensions of frame sections via the section overlay module 214, and view structure shell beams of a full body model built based on the configured frame model.

The model module 212, in the example embodiment, allows engineers to define the design requirements and design constraints for a vehicle during concept design (e.g., draw possible paths of the structure), build frame models (e.g., LMS models) for vehicle frames, configure target parameters (e.g., force, moment) for various frame sections, and optimize the frame models for crashworthiness.

The section overlay module 214, in the example embodiment, is configured to provide an overlay window within the design interface. Upon selection of a frame member, the GUI module 210 invokes the section overlay module 214 to display an overlay window within the design interface. The overlay window includes a section dimensions area that displays current values of various section dimensions (e.g., height, width, gauge thickness, and material grade) of the selected member. Further, the section dimensions area also provides input actions that allow the user 102 to change section dimensions (e.g., toggle buttons for various possible material grades or gauge thicknesses, slide bars or input boxes for height and width dimensions). The overlay window also includes a target area and a predictions area. The target area displays target parameters and values associated with the selected section (e.g., target crush force, target bending moment), as defined during initial model construction. The predictions area includes prediction values for one or more of the target parameters (e.g., predicted crush force, predicted bending moment) provided by the prediction module 216. In some embodiments, the predictions area may also include an error metric embodying a difference between a value of a target parameter and a prediction value (e.g., crush force error percentage, bending moment error percentage). In some embodiments, the overlay window may also include a cross-section diagram of an underlying cross-section type for the selected section. The cross-section diagram may pictorially illustrate one or more of the various section parameters, such as height, width, or gauge thickness.

Figure 5:
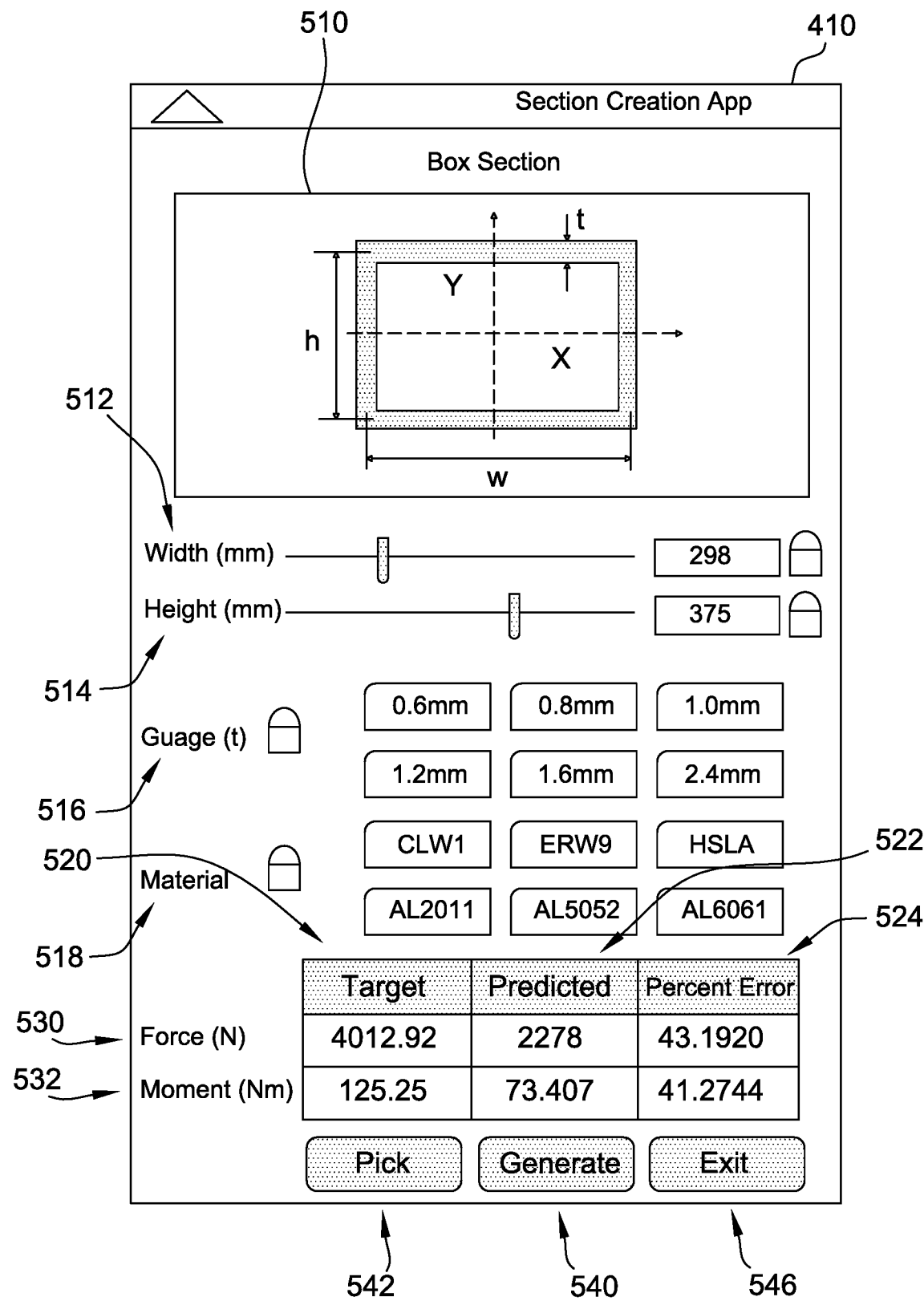

The prediction module 216 is configured to generate the prediction values displayed in the predictions area. In the example embodiment, the prediction module 216 accesses the model database 116 to retrieve models (e.g., response surface methodology (RSM) models) from a library of such models. The prediction module 216 uses one or more of the RSM models to generate prediction values that are populated into the overlay window (e.g., as the user 102 alters section dimensions). For example, the user 102 may change the width of a section in the overlay window by clicking and dragging a slide bar from 40 millimeters (mm) to 80 mm, while leaving height at 40 mm, gauge at 0.8 mm, and material yield stress at 300 megapascals (MPa). To generate a crush force prediction value, the prediction module 216 identifies one RBF for crushing force from the RSM models library based on the current section dimensions selected by the user. Similarly, to generate a bending moment prediction value, the prediction module 216 may also identify another RBF for bending moment from the RSM models library based on the current section dimensions selected by the user. Each of these RBFs are arithmetic functions derived using RSMs and take a set of input dimensions to identify their associated outputs. In a rectangular cross-section example such as shown in FIG. 5, the inputs for both RBFs include width and height of the cross-section, thickness of the sides, and material grade. As such, the RBFs for box section components are 4-dimensional models. In other embodiments, RSMs and RBFs for other cross-sections may be provided, each similarly having an RBF for crushing force and an RBF for bending moment of various input parameters.

In some embodiments, the section design module 130 may also include a simulation module 218. The simulation module 218 may allow engineers to build and optimize the LMS model of a vehicle frame, identifying the design space that concept and packaging designers have defined and positioning rigid-like bodies such as powertrain, suspensions, heat exchangers, and passenger compartment. The simulation module 218 may also allow engineers to optimize the model for crashworthiness performance (e.g., optimizing the stiffness level of the components for desired acceleration, intrusion, and the time or rebound). The simulation module 218 may be used to pre-configure the RSM models database 116 with RSM models for particular member profiles and section dimensions. For example, the simulation module 218 may be used to build individual RSM models by simulating axial collapse and bending by applying prescribed displacement and rotation based loading on a section member of a particular cross-sectional profile and with particular section dimensions. As such, for a particular cross-sectional profile type, the simulation module 218 may be used to build RSM models (force, moment) for numerous combinations of the section dimensions to create the RSM library that is used for predictions.

Figure 3:
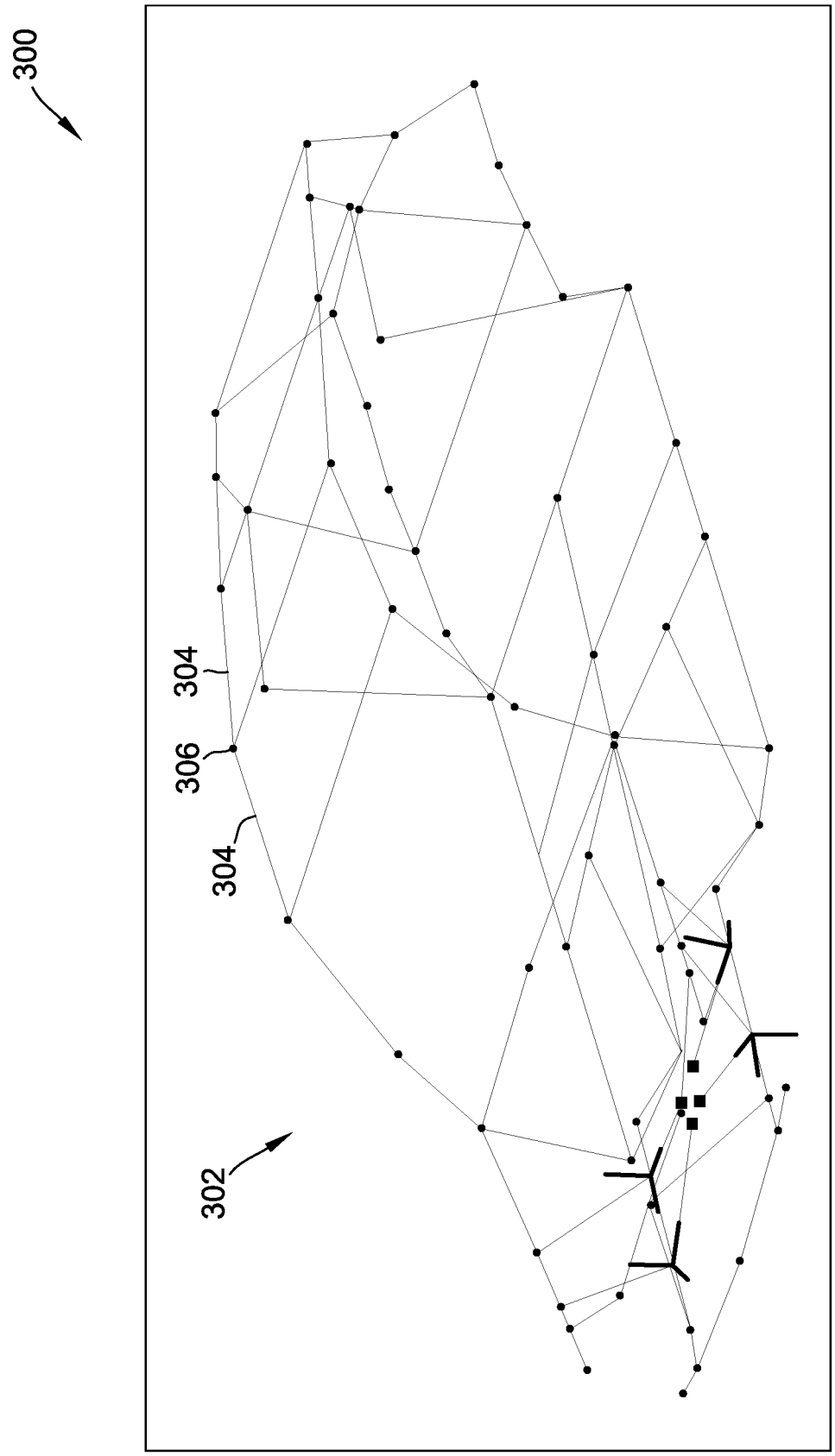

FIG. 3 illustrates an example view of a design interface 300 presented by the design system 100 (e.g., the section design module 130) to the user 102. In the example embodiment, the design interface 300 displays a mass-spring model 302 of a vehicle frame in concept design. The model 302 includes section members 304 of the vehicle frame that attach to other section members 304 at junctions 306 to form a representation of the vehicle frame at this stage of design. In the context of mass-spring modeling, the junctions 306 represent masses and the section members 304 represent non-linear springs.

In the example embodiment, the model 302 is generated during early vehicle design, starting with initial information on vehicle specifications, which gives an idea of the lowest allowable acceleration during crash scenarios. Along with this initial information, the initial package layout gives an approximate idea of the deformable and undeformable zone. With these data, targets of maximum acceleration and maximum deformation distance can be determined. In addition to these two primary targets, the time to maximum deformation is selected as a target variable to examine how fast the structure can decelerate (e.g., for purposes of passenger protections).

Once the rigid bodies and the design space are defined, engineers model variations of the structure by positioning and connecting the springs in the design space, and then find a desirable combination among the various variations using the Design of Experiments (DOE) method. The force-displacement and moment-angle of each component are defined as the design parameters and the maximum acceleration and maximum displacement are the targets of the DOE. The results show which components contribute to achieving the targets. As such, the engineer can use these results to quickly narrow down the distribution of load paths to a few and select a desirable combination. Once a structure is selected, then parametric optimization may be performed to determine the optimal distribution of the spring stiffness. Such parametric optimization may include running the model thousands of times. The performance of the lumped mass-spring model 302, however, can be performed in suitably fast time (e.g., in a few hours). In the concept design stage, it may be acceptable to sacrifice some accuracy for performance (e.g., over an FE model approach, which has a much longer solution time for more accurate results). At this stage, a rough estimation is acceptable if it can provide enough information to allow decisions to be made regarding design direction.

For the model 302 shown in FIG. 3, at this stage of design, the user 102 (e.g., a design engineer) has the optimized mass-spring model 302 and is preparing to configure section dimensions for each section member 304. The design interface 300 allows the user 102 to manipulate the view of the model 302, translating or rotating the model 302, zooming in or out, and so forth.

Figure 4:
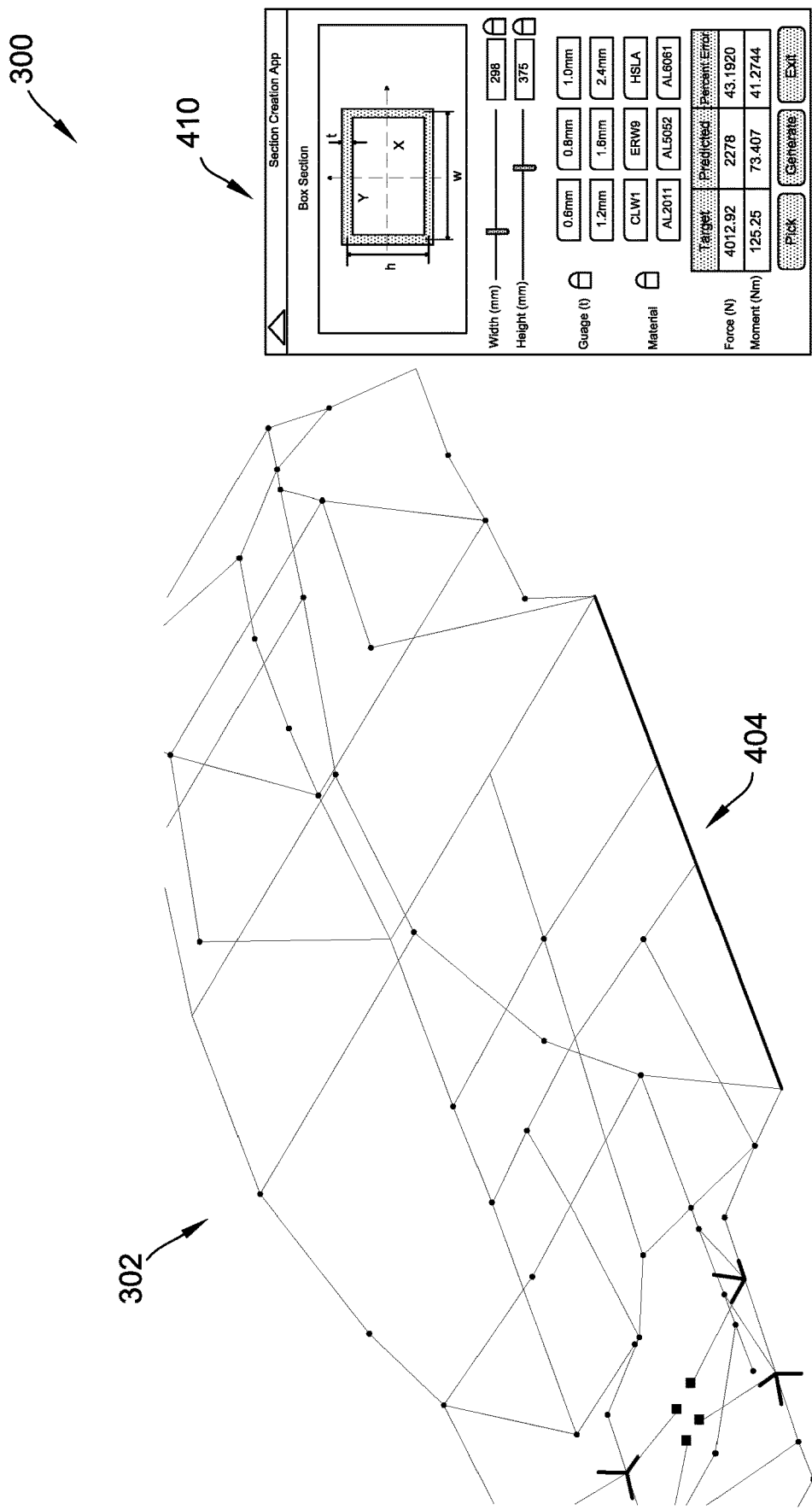

FIG. 4 illustrates another example view of the design interface 300 in which a section configuration panel 410 is provided. In the example embodiment, the section configuration panel 410 is provided by the section design module 130 as an overlay window within the design interface 300 when the user 102 selects a section member 404. Upon selection of the section member 404, the section design module 130 highlights the selected section member 404 and displays the section configuration panel 410 for use by the user 102. The section configuration panel 410 is populated with various configuration information about the section member 404 and allows the user 102 to change components of that configuration information and view prediction information based on the current configuration.

FIG. 5 illustrates the section configuration panel 410 provided by the section design module 130. In the example embodiment, the section configuration panel 410 includes current values for various section dimensions of the selected section member 404, including width 512 (e.g., (w), in mm), height 514 (e.g., (h), in mm), gauge 516 (e.g., thickness (t), in mm), and material 518 (e.g., by material type identifier). The section configuration panel 410 displays current values for each of the section dimensions (e.g., as a numerical value shown in a box, as a depressed button). Further, the section configuration panel 410 allows the user 102 to edit or otherwise change the section dimensions (e.g., via moving a slide par, inputting a new value, pressing another button). As such, the user 102 can edit current settings for the section dimensions. In the example embodiment, the section design module 130 provides widths and heights in whole numbers across a continuous range of widths and heights (e.g., any integer value between 20 and 300 (mm)). In some embodiments, the section design module 130 may limit the width 512 or height 514 based on multiple pre-determined widths or heights (e.g., toggling the slider bar through only those multiple pre-determined widths or heights). In some embodiments, the section design module 130 may limit the width 512 or height 514 based on available dimensions of RSM models available for the current cross-section from the RSM model database 116. The section configuration panel 410 may also include lock buttons for one or more of the section dimensions. The lock button for a particular section dimension may be used as a toggle button, allowing the user 102 to change that section dimension (e.g., while unlocked) and then lock that section dimension to help ensure that no changes are inadvertently made to that dimension.

The section configuration panel 410, in the example embodiment, also includes a profile view box 510 that illustrates a cross-section shape of the selected section member 404 (e.g., rectangular, in this example). The profile view box 510 also visually depicts some of the section dimensions to facilitate user understanding (e.g., h for height, w for width, t for gauge). In some embodiments, the section configuration panel 410 may allow the user to select from various cross-sections (e.g., rectangular, elliptical, double-hat, or other custom created cross-sections). In some embodiments, the section design module 130 may dynamically determine which cross-sections to provide to the user for selection based on availability of RSMs and RBFs for the given cross-section in the RSM model database 116. Further, for the various available cross-sections, the section design module 130 may store and populate the section configuration panel 410 with a cross-section profile image (e.g., box section 510) and input widgets for various input parameters used with the particular cross-section RBFs (e.g., slide bars, selection buttons such as width 512, height 514, gauge 516, and material 518).

In the example embodiment, the section configuration panel 410 also displays target values 520, predicted values 522, and percent error 524, and for each, a force (e.g., in newtons (N)) and a moment (e.g., in newton-meters (Nm)). The target values 520 represent a target crushing force and target moment that has been previously assigned to the selected section member 404 as having to withstand. The predicted values 522 are predicted crushing force and predicted moment generated by the design system 100 that the selected section member 404 is predicted to be able to withstand based on the current section dimensions selected by the user 102. The percent error 524 is a percentage error generated by the design system 100 based on a difference between one of the target values 520 (e.g., force 530) and the associated predicted values 530. For example, the section design module 130 may compute the percent error as:

$$\text{Percent Error} = 100 - \frac{\text{predicted value}}{\text{target value}} * 100.$$

During operation, the user 102 may change one or more of the section dimensions and press a generate button 540 to compute the predicted values for force and moment. The section design module 130 reads the current values of the section dimensions (e.g., as showing on the section configuration panel 410) and uses those values to determine predicted force and predicted moment based on the RMS models in the RMS model database 116, as described above. The section design module 130 may also compute the percent error for force and moment based on the determined prediction values. The section design module 130 displays both the predicted values and the percent error values on the section configuration panel 410, thereby allowing the user 102 to see an approximation of how close the current section dimensions are to target values. In some embodiments, the section design module 130 may automatically determine new predicted values when a change in any of the section dimensions is detected within the section configuration panel 410. Automatic change detection and updating of prediction values allows the user 102 to more quickly make changes and promptly see the results of those changes (e.g., without having to press an extra button).

In some embodiments, the section design module 130 automatically saves the section dimensions for the selected section member 404 as configured within the section configuration panel 410. Once the user 102 is content with the chosen section dimensions, the user 102 may press an exit button 546 to close the section configuration panel 410. In some embodiments, the section design module 130 allows the user 102 to select another section member 304 for inspection and configuration. As such, the section design module 130 may read current values for the new selected section member and populate the section configuration panel 410, overwriting the section dimensions, target values, and prediction values of the prior selected section member 404 with section dimensions and target values of the newly selected section member. The section design module 130 may also automatically determine and display the prediction values for the newly selected section member (e.g., based on any previously-saved section dimensions for that section member).

As such, the user 102 may configure each of the section members 304 via the design interface 300 and the section configuration panel 410. Once each of the section members 304 are configured with section dimensions, the model 302 may be used to build a shell meshed model (not shown) for the structural skeleton of the vehicle. Each of the section members of the shell meshed model are created based on the section dimensions set by the user 102 within the design interface 302. The shell meshed model may then be used by the CAD software system 120 to verify crash behavior and test other basic performances in various computer simulations (e.g., crash test simulations).

Figure 6A:
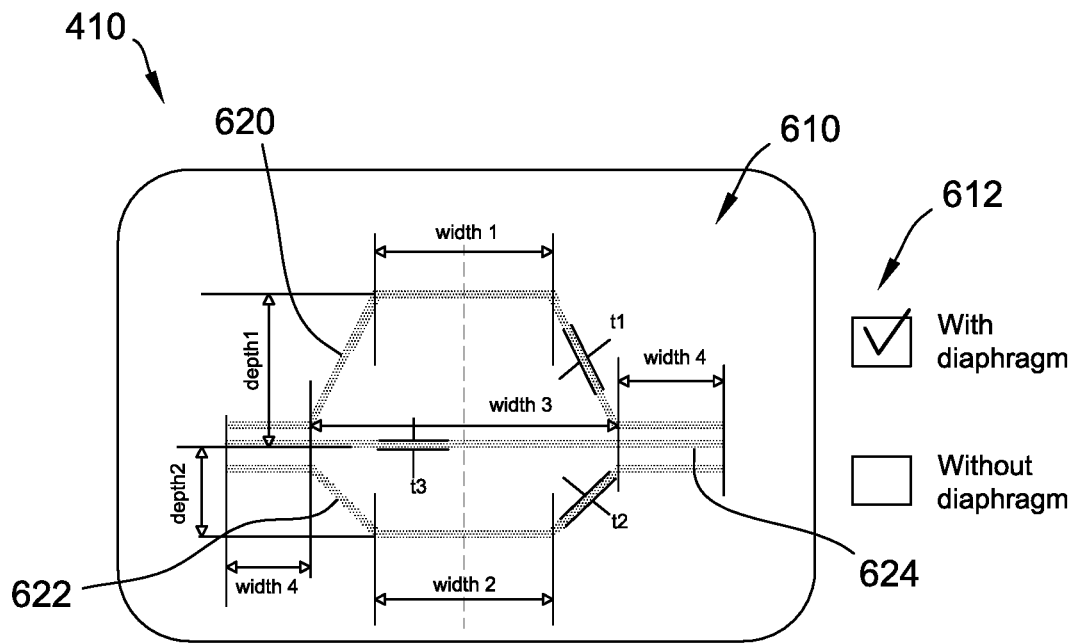
FIGS. 6A and 6B illustrate the section configuration panel with two similar double-hat cross-sections.
Figure 6B:
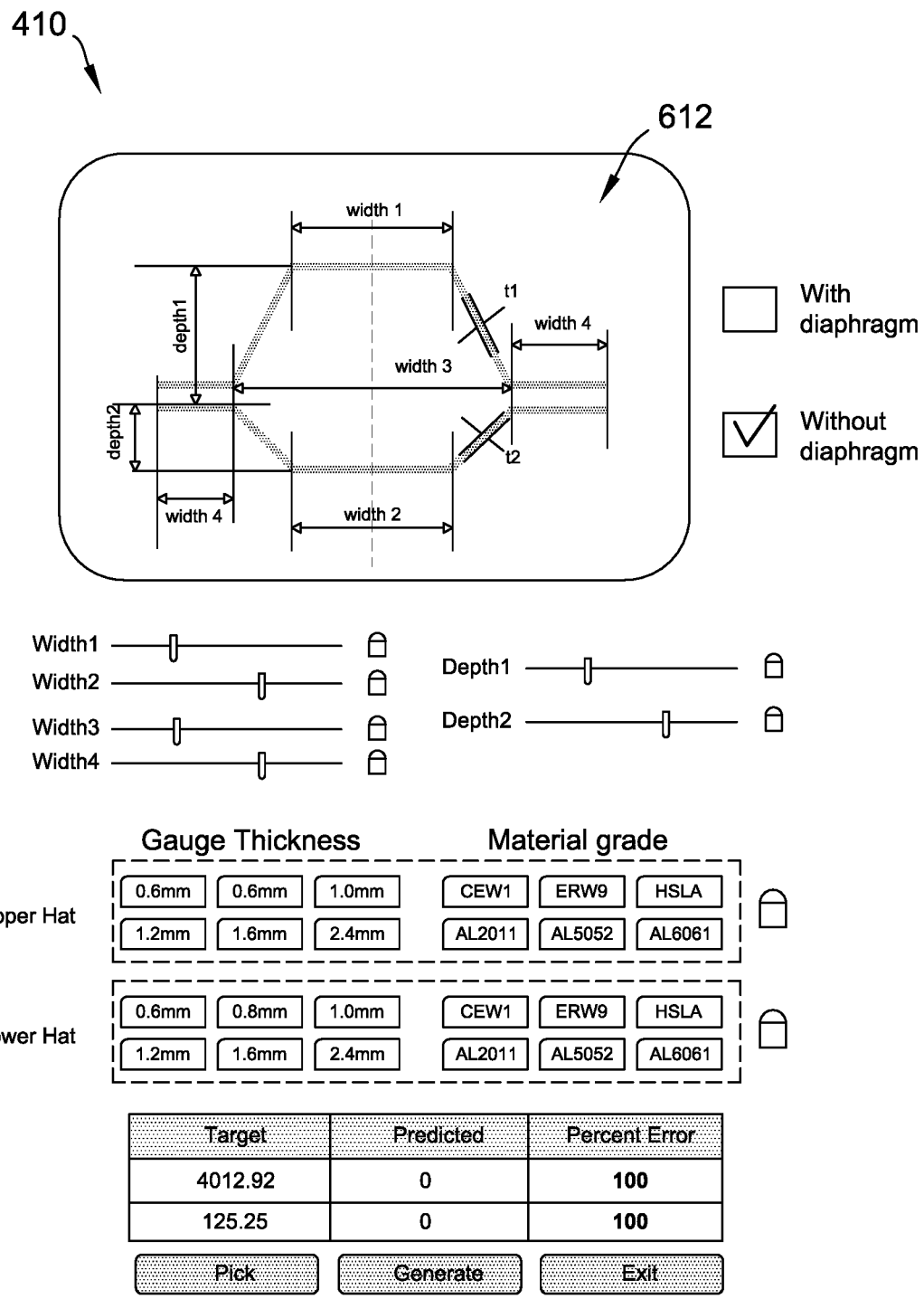

FIGS. 6A and 6B illustrate the section configuration panel 410 with two similar double-hat cross-sections. FIG. 6A illustrates a double-hat cross-section 610 with a diaphragm. FIG. 6B illustrates a double-hat cross-section 612 without a diaphragm. In the example embodiment, cross-sections 610, 612 include an upper hat component 620 and a lower hat component 622. The cross-section 610 additionally includes a diaphragm component 624. The section design module 130 stores and retrieves RBFs for both of the cross-sections 610, 612 separately (e.g., as each would have different response profiles), and for both crushing force and bending moment. Each of the RBFs for the cross-sections 610, 612 uses various widths and depths for various dimensions of components, as well as gauge thicknesses and material grades for various elements of the components 620-624. The section configuration panel 410 provides input widgets for each of these input parameters, allowing the user to alter each and view subsequent output values. The section configuration panel 410 may provide check boxes 612 that allow the user to switch between the double-hat cross-section 610 with diaphragm and the double-hat cross-section 612 without diaphragm.

As will be appreciated based on the foregoing specification, the above-described embodiments of the disclosure may be implemented using computer programming or engineering techniques including computer software, firmware, hardware or any combination or subset thereof, wherein the technical effect is a system for generating stable material models and using such stable material models in computer simulations. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps", or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

At least one of the technical problems addressed by this system includes: (i) allowing a design engineer to work in easily understood terms (e.g., section dimensions, target force/moment versus predicted force/moment, percent errors) without necessarily having deep knowledge of simulations; (ii) pre-staging simulation results for various combinations and permutations of section dimensions and section profile geometries to improve response performance within the design interface. Other technical problems addressed by the system and methods described herein may include increased computer processing due to unnecessary components appearing in the system, thus slowing down the computer.

The methods and systems described herein may be implemented using computer programming or engineering techniques including computer software, firmware, hardware, or any combination or subset thereof, wherein the technical effects may be achieved by performing at least one of the following steps: (i) displaying, to a user and on a display device, a graphical user interface that includes a model of a vehicle frame, wherein the model includes a plurality of section members of the vehicle frame and a plurality of junctions connecting, wherein each junction of the plurality of junctions attaches two or more section members of the plurality of section members; (ii) displaying, on the display device, a section configuration panel that includes one or more section dimension values for one or more section dimensions of a first section member of the plurality of section members; (iii) retrieving a first response surface model from a plurality of response surface models based on values of the one or more section dimensions for the first section member, wherein each response surface model of the plurality of response surface models is in an n-dimensional space including (a) one or more section dimensions of section members of a vehicle design and (b) one of force and moment; (iv) determining one or more predicted values associated with the first section member based on the values of the one or more section dimensions of the first section member, wherein the one or more predicted values include one or more predicted crash resistances for the section member; and (v) displaying the one or more predicted values in the graphical user interface, thereby allowing the user to evaluate the one or more predicted values for suitability in vehicle design.

The resulting technical effect achieved by this system is at least one of improving computational performance within the design interface by avoiding having to perform simulations when new section dimensions are input for a particular section member, improving usability of the design interface for design engineers.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer-aided design system comprising:
   a display device;
   a memory storing a plurality of response surface models, each response surface model of the plurality of response surface models is in an n-dimensional space including (a) one or more section dimensions of section members of a vehicle design and (b) one of force and moment; and
   a processor configured to execute instructions stored in the memory, which, when executed by the processor, cause the processor to at least:
      display, to a user and on the display device, a graphical user interface that includes a displayed model of a vehicle frame, the displayed model includes a plurality of section members of the vehicle frame and a plurality of junctions connecting, each junction of the plurality of junctions attaches two or more section members of the plurality of section members, the displayed model is a lumped mass- spring (LMS) model, the plurality of section members represent springs within the LMS model, the plurality of junctions represent masses within the LMS model;
      display, on the display device, a section configuration panel that includes one or more section dimension values for one or more section dimensions of a first section member of the plurality of section members;
      provide, in the section configuration panel, a user input widget for a first section dimension of the one or more section dimensions, the user input widget accepts an input value for the first section dimension;
      receive, through the user input widget, a new value of the first section dimension;
      retrieve a first response surface model from the plurality of response surface models based on the one or more section dimension values for the first section member;
      automatically compute one or more predicted values associated with the first section member using one or more of the section dimension values, including the new value of the first section member, the one or more predicted values include one or more predicted crash resistances for the section member; and
      display the one or more predicted values in the graphical user interface.

2. The computer-aided design system of claim 1, wherein the instructions further cause the processor to:
   generate a shell meshed model for the vehicle frame based on the section dimension values for the plurality of section members; and
   execute a crash test simulation of the vehicle design based on the shell meshed model.

3. The computer-aided design system of claim 1, wherein displaying the section configuration panel includes:
   receiving, in the graphical user interface, a selection input selecting the first section member;
   retrieving one or more stored values for the first section member; and
   automatically displaying the section configuration panel based on the receiving of the selection input, the section configuration panel displays the one or more stored values as the one or more section dimension values.

4. The computer-aided design system of claim 1, wherein the plurality of response surface models are response surface methodology (RSM) models, wherein the predicted crash resistances are one or more of a predicted crushing force and a predicted moment.

5. The computer-aided design system of claim 1, wherein the instructions further cause the processor to:
   display, in the section configuration panel, one or more target values associated with the first section member, the one or more target values including one or more of a target crush force and a target moment;
   compute a predicted error value based on a comparison of the one or more target values and the one or more predicted values; and
   display the predicted error value in the graphical user interface.

6. A method of providing a computer-aided design interface, the method is performed by a processor with a memory, the method comprising:
   displaying, to a user and on a display device, a graphical user interface that includes a displayed model of a vehicle frame, the displayed model includes a plurality of section members of the vehicle frame and a plurality of junctions connecting, each junction of the plurality of junctions attaches two or more section members of the plurality of section members, the displayed model is a lumped mass-spring (LMS) model, the plurality of section members represent springs within the LMS model, the plurality of junctions represent masses within the LMS model;

displaying, on the display device, a section configuration panel that includes one or more section dimension values for one or more section dimensions of a first section member of the plurality of section members;

displaying, in the section configuration panel, a user input widget for a first section dimension of the one or more section dimensions, the user input widget accepts an input value for the first section dimension;

receiving, through the user input widget, a new value of the first section dimension;

retrieving a first response surface model from a plurality of response surface models based on values of the one or more section dimensions for the first section member, each response surface model of the plurality of response surface models is in an n- dimensional space including (a) one or more section dimensions of section members of a vehicle design and (b) one of force and moment;

automatically determining one or more predicted values associated with the first section member using one or more of the section dimension values, including the new value of the first section member, the one or more predicted values include one or more predicted crash resistances for the section member; and displaying the one or more predicted values in the graphical user interface.

7. The method of claim 6, further comprising:
generating a shell meshed model for the vehicle frame based on the section dimension values for the plurality of section members; and
executing a crash test simulation of the vehicle design based on the shell meshed model.

8. The method of claim 6, wherein displaying the section configuration panel includes:
receiving, in the graphical user interface, a selection input selecting the first section member;
retrieving one or more stored values for the first section member; and
automatically displaying the section configuration panel based on the receiving of the selection input, the section configuration panel displays the one or more stored values as the one or more section dimension values.

9. The method of claim 6, wherein the plurality of response surface models are response surface methodology (RSM) models, wherein the predicted crash resistances are one or more of a predicted crushing force and a predicted moment.

10. The method of claim 6, further comprising:
displaying, in the section configuration panel, one or more target values associated with the first section member, the one or more target values including one or more of a target crush force and a target moment;
computing a predicted error value based on a comparison of the one or more target values and the one or more predicted values; and
displaying the predicted error value in the graphical user interface.

11. A non-transitory computer-readable storage media having computer-executable instructions embodied thereon, wherein, when executed by at least one processor, the computer-executable instructions cause the processor to:
store, in a memory, a plurality of response surface models, each response surface model of the plurality of response surface models is in an n-dimensional space including (a) one or more section dimensions of section members of a vehicle design and (b) one of force and moment; and display, to a user and on the display device, a graphical user interface that includes a displayed model of a vehicle frame, the displayed model includes a plurality of section members of the vehicle frame and a plurality of junctions connecting, each junction of the plurality of junctions attaches two or more section members of the plurality of section members, the displayed model is a lumped mass-spring (LMS) model, the plurality of section members represent springs within the LMS model, the plurality of junctions represent masses within the LMS model;

display, on the display device, a section configuration panel that includes one or more section dimension values for one or more section dimensions of a first section member of the plurality of section members;

provide, in the section configuration panel, a user input widget for a first section dimension of the one or more section dimensions, the user input widget accepts an input value for the first section dimension;

receive, through the user input widget, a new value of the first section dimension;

retrieve a first response surface model from the plurality of response surface models based on values of the one or more section dimensions for the first section member;

automatically determine one or more predicted values associated with the first section member using one or more of the section dimension values, including the new value of the first section member, the one or more predicted values include one or more predicted crash resistances for the section member; and display the one or more predicted values in the graphical user interface, thereby allowing the user to evaluate the one or more predicted values for suitability in vehicle design.

12. The non-transitory computer-readable medium of claim 11, wherein the computer-executable instructions further cause the processor to:
generate a shell meshed model for the vehicle frame based on the section dimension values for the plurality of section members; and
execute a crash test simulation of the vehicle design based on the shell meshed model.

13. The non-transitory computer-readable medium of claim 11, wherein displaying the section configuration panel includes:
receiving, in the graphical user interface, a selection input selecting the first section member;
retrieving one or more stored values for the first section member; and
automatically displaying the section configuration panel based on the receiving of the selection input, the section configuration panel displays the one or more stored values as the one or more section dimension values.

14. The non-transitory computer-readable medium of claim 11, wherein the computer-executable instructions further cause the processor to:
display, in the section configuration panel, one or more target values associated with the first section member, the one or more target values including one or more of a target crush force and a target moment;

compute a predicted error value based on a comparison of the one or more target values and the one or more predicted values; and display the predicted error value in the graphical user interface.

\* \* \* \* \*